Feb. 27, 1962 F. R. BALISH 3,023,372

PRECISION VARIABLE FREQUENCY GENERATOR

Filed Jan. 13, 1958 2 Sheets-Sheet 1

Inventor
Frank R. Balish
by Hill, Sherman, Meroni, Gross & Simpson Attys

PRECISION VARIABLE FREQUENCY GENERATOR

Filed Jan. 13, 1958 2 Sheets-Sheet 2

Inventor
Frank R. Balish
by Attys

United States Patent Office 3,023,372

Patented Feb. 27, 1962

3,023,372

PRECISION VARIABLE FREQUENCY GENERATOR

Frank R. Balish, Willoughby, Ohio, assignor to Thompson Ramo Wooldridge Inc., a corporation of Ohio Filed Jan. 13, 1958, Ser. No. 708,696
4 Claims. (Cl. 331—39)

The present invention relates to a variable frequency generator and particularly to an improved system for generating frequencies in accordance with a digital input signal.

The present invention is particularly adapted for use in the general system disclosed in a copending application of Arthur F. Naylor Serial No. 704,372, filed December 23, 1957 and entitled "Precision Variable Frequency Generator."

It is an object of the present invention to provide a novel and improved variable frequency generator.

A further object of the invention resides in the provision of a system for generating frequencies in accordance with an input digital signal of substantially greater simplicity than that of the aforementioned copending application.

A more specific object of the invention is to provide a system for generating frequencies in accordance with the number represented by an electrical input signal in binary code form utilizing only two sets of switches between the frequency sources and the output of the system.

In one embodiment in accordance with the present invention, a series of frequency sources is provided corresponding to successive code positions in the binary code, a corresponding series of frequency mixers, and a single set of switches for connecting the frequency sources in a chain to generate a desired frequency. Each frequency mixer has a first input for connection to one of two input frequency sources and has a second input connected to the output of the preceding frequency mixer in the series.

Figure 1:
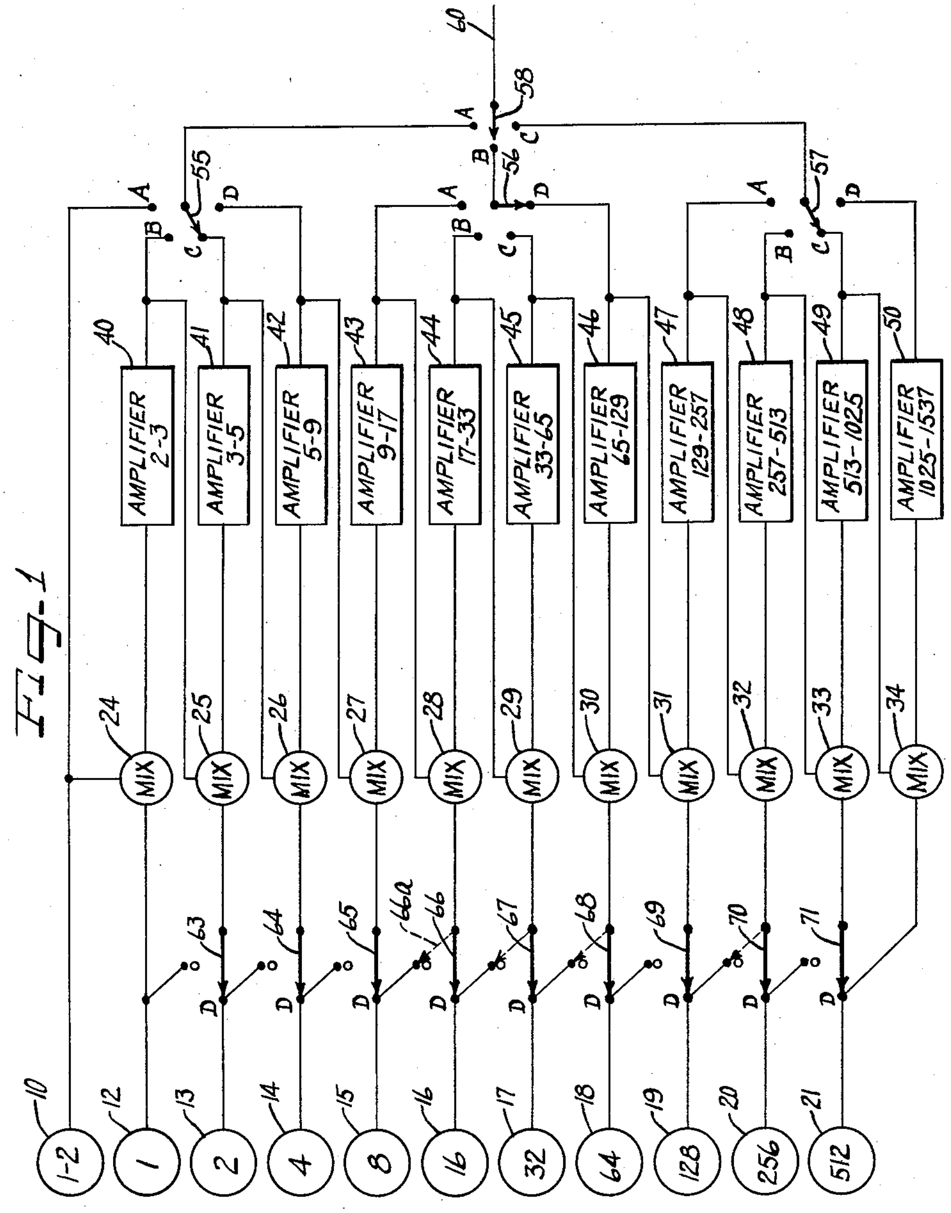
Figure 2:
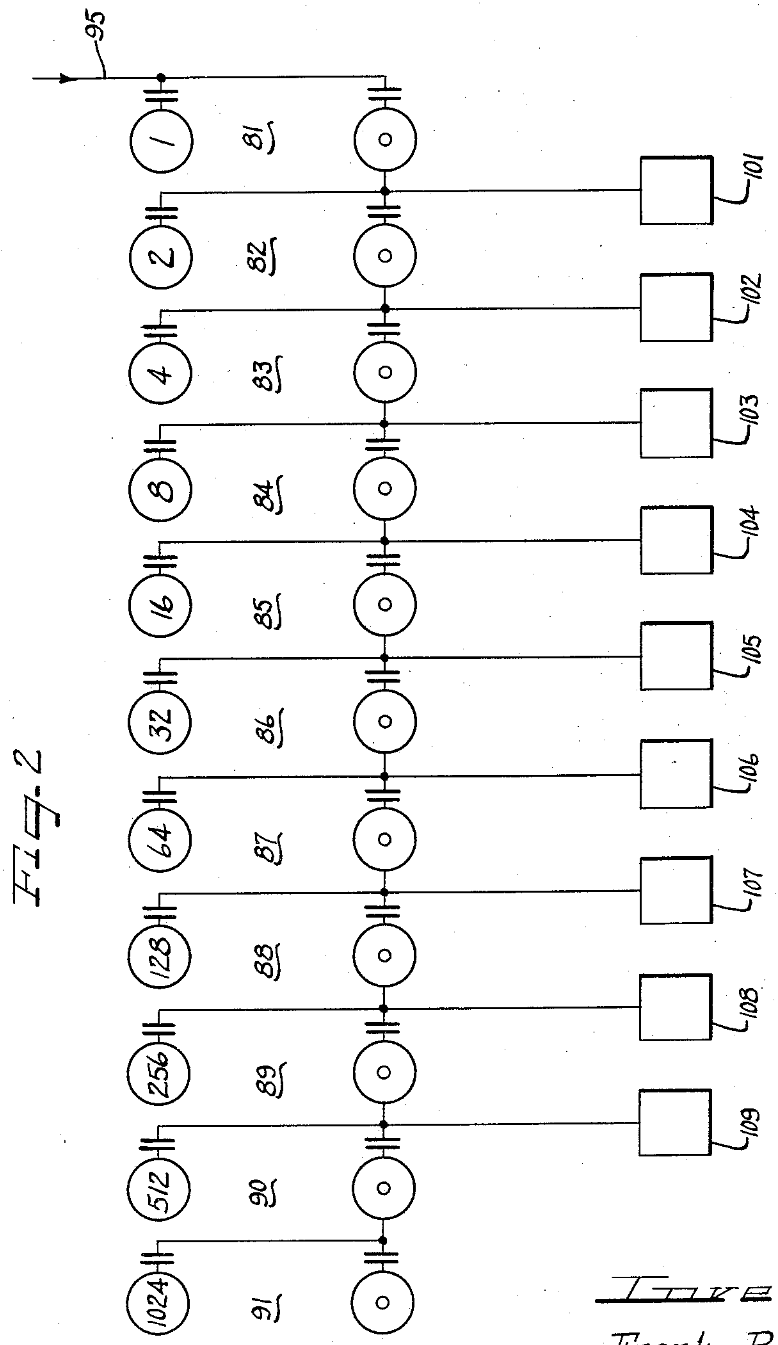

Other objects, features and advantages of the present invention will be apparent from the following detailed description taken in connection with the accompanying drawings, in which:

FIGURE 1 is a diagrammatic illustration of a system of frequency sources and switches in accordance with an embodiment of the present invention; and FIGURE 2 is a diagrammatic illustration of a suitable system for controlling the selection of the frequency of the generator in accordance with an input digital signal.

As shown on the drawings:

Referring to FIGURE 1, there is illustrated a system for generating frequencies between 1 and 1537 megacycles per second, by way of illustration. It will be appreciated that the invention contemplates coverage of other desired frequency ranges in a manner which will be apparent to those skilled in the art from the following description of the illustrated embodiment.

In the illustrated embodiment, a variable frequency oscillator 10 is preferably provided for generating frequencies between 1 and 2 megacycles per second. Fixed frequency sources 12 through 21 may provide frequencies of 1, 2, 4, 8, 16, 32, 64, 128, 256 and 512 megacycles per second, respectively. A series of frequency mixers 24 through 34 are provided for combining the outputs of the system components, for example to add frequencies appearing at the first and second inputs thereof. The first mixer 24 of the series has a first input connected to frequency source 12 and its second input connected to variable frequency oscillator 10. Mixers 25 through 33 have first inputs connected to frequency sources 13 through 21, respectively and second inputs connected to the outputs of mixers 24 through 32, respectively, through amplifiers 40 through 48. The first input of mixer 34 may be connected to frequency source 21 and the second input of mixer 34 may be connected to the output of mixer 33 through amplifier 49. The output of mixer 34 may be connected to the input of an amplifier 50. Selector switches 55, 56, 57 and 58 are selectively connectable with the outputs of amplifiers 40–50 and variable frequency oscillator 10 so that any one of these components may be connected with output 60. A series of switches 63–71 are operative to connect the first inputs of mixers 25 through 33 with frequency sources 13 through 21 or 12 through 20, respectively.

FIGURE 2 illustrates the manner in which the switches 63 through 71 are controlled in accordance with a binary input signal to generate a desired frequency. The binary signal is delivered to a series of register units 81–91 by any suitable means such as indicated diagrammatically at 95. It will be understood that the number corresponding to the desired frequency may be generated in any suitable manner such as that illustrated in the aforementioned copending application, and the signal may be supplied to the register units in series or in parallel, as desired. In the illustrated embodiment, register units 81–89 control switch actuating mechanisms 101–109 which control actuation of switches 63–71, respectively. In the illustrated embodiment, mechanisms 101–109 are operative to shift switches 63–71 from their direct or D positions shown to their offset or O positions when the corresponding register units 81–89 are in "zero" condition. When the register units 81–89 are in "one" condition, switches 63–71 remain in their direct positions as shown in FIGURE 1. The register units 81–91 may also be utilized to control selector switches 55–58 to select the output of the amplifier corresponding to the desired frequency of the generator, or alternatively the selector switches 55–58 may be actuated manually.

To illustrate operation of the system, suppose that a frequency of 120 megacycles per second is to be generated. 1.00 megacycle per second may be supplied by variable frequency oscillator 10, so that 119 megacycles per second is to be furnished by the system including fixed frequency sources 12–21. The number 119 may be written in binary form 00001110111. If this number is fed in binary code form to register units 81–91, register units 81–83 will be in "one" condition, register unit 84 will be in "zero" condition, register units 85–87 will be in "one" condition and register units 88–91 will be in "zero" condition. Correspondingly, actuating circuits 101–103 will be in normal condition with the corersponding switches 63–65 in direct position, actuating circuit 104 will be in actuated condition to move switch arm 66 to offset position, actuating circuits 105 to 107 will be in normal condition, and actuating circuits 108 and 109 will be in actuated condition. The condition of actuating circuits 108 and 109 is not significant for the number 119, since selector switch 58 will be in its B position and the outputs of amplifiers 47–50 will be isolated from output line 60. Selector switch 56 will be in its D position to connect output line 60 with the output of amplifier 46 which may have a range between 65 and 129 megacycles per second.

With the binary number 119 in register units 81–91, switch 66 will be actuated to its offset position as indicated in dotted outline at *66a* in FIGURE 1, and frequencies will be generated in mixers 24–30 as follows: mixer 24 will generate a frequency of 2.00 megacycles per second; mixer 25, 4.00 megacycles per second; mixer 26, 8.00 megacycles per second; mixer 27, 16.00 megacycles per second; mixer 28, 24.00 megacycles per second; mixer 29, 56.00 megacycles per second; and mixer 30, 120.00 megacycles per second.

It will be observed that in generating the number 119 by means of the system including fixed frequency sources 12–21, instead of omitting the frequency source 15 which provides an output of 8 megacycles per second, in effect the output for the next succeeding code position which would normally be 16 megacycles per second is reduced by 8 megacycles per second. In this way, it is unnecessary to skip any of the mixers in generating a given number. The switching is thus tremendously simplified as compared with a system operating by direct analogy with the binary system.

While operation in the megacycle frequency range just described is at present considered to be most significant, the circuit of FIGURES 1 and 2 is, of course, directly applicable to any desired frequency range. For example, if output frequencies in the range from 1 to 1537 kilocycles per second were desired, fixed frequency sources 12–21 would provide successive frequencies in the range between 1 kilocycle and 512 kilocycles per second, and variable frequency oscillator 10 would provide frequencies between 1 and 2 kilocycles per second. Accordingly, there is no intention to limit the present disclosure to the megacycle range, and the number designations within the circles representing frequency sources 12–21 and within the rectangles representing amplifiers 40–50 are intended simply to represent relative values and might in an actual circuit represent kilocycles, tens of kilocycles, hundreds of kilocycles, megacycles or any other suitable units. The circuits of FIGURES 1 and 2 thus have utility in other frequency ranges than the megacycle range which is a preferred example, and the drawings are specifically intended to illustrate the other frequency ranges referred to herein.

In the case where the circuits of FIGURES 1 and 2 are taken to represent the megacycle range, frequency sources 12–21 are preferably crystal controlled. The higher frequencies are preferably derived from one fixed frequency by doubling and quadrupling through selective tank circuits tuned to the desired frequency such as 512 megacycles per second for frequency source 21. In the present state of the art, it is practical to use frequency doubling up to 2000 megacycles per second with efficiency and output sufficient for the present embodiment of the invention. The mixers or frequency adders 24–34 preferably operate by known heterodyning techniques. With the illustrated circuits, the mixer stages 24–29 which operate up to a frequency of 65 magacycles per second are preferably conventional grid-cathode mixers with untuned plate circuits. For mixers 30–34 handling frequencies above 65 megacycles per second, the tank circuit of the mixer will be tunable over the spectrum of frequencies indicated for the associated amplifiers 46–50. Means for automatically tuning the tunable mixers is described in the aforementioned copending application, but for the purposes of the present description, it may be assumed that tuning will be done manually. The tunable tank circuits of the mixers 30–34 preferably have a reasonably high "Q" so as to realize gain and selectivity.

In the case where the amplifiers 40–50 are to operate in the megacycle range, amplifiers 40–47 may utilize distributed amplifier technique. Gains in excess of 10 db have been achieved with band widths to 200 megacycles per second. Amplifiers 48–50 may employ modified broad banding techniques approaching a tunable radio frequency amplifier, preferably with a reasonably high "Q" so as to realize gain and selectivity.

The switches 63–71 if utilized in the megacycle range, may be two position coaxial switches having solenoid actuating mechanisms controlled by circuits such as indicated at 101–109 in FIGURE 2.

The output switches indicated at 55–58 may comprise four position coaxial switches and preferably provide the maximum practical isolation and reduction of cross-talk between channels.

It will be apparent that the present invention also comprehends the embodiment wherein variable frequency oscillator 10 is omitted or replaced by a fixed frequency oscillator, for example of 1 megacycle per second, in which case the system might be utilized to generate frequencies corresponding to integral numbers in a given range.

Thus, with the simple logical circuitry illustrated in FIGURES 1 and 2, a binary number input signal may be utilized to control switches 63–71 to provide output frequencies between 1 and 1537 units, where the frequency band is not such as to require tuning of the mixers 24–34 and of the amplifiers 40–50. With additional circuitry such as described in the aforementioned copending application, frequencies in the megacycle range may be automatically generated in response to an input binary signal.

*Summary of Operation*

By way of example, if it is desired to generate a frequency of 1352.73 megacycles per second, variable frequency oscillator 10 may be set to 1.73 megacycles and a binary signal corresponding to number 1351 may be supplied to the register units 81–91 in FIGURE 2. The number 1351 would be written in the binary code as 10101000111. Thus, register units 81, 82 and 83 would be in a "one" condition, register units 84–86 would be in a "zero" condition, register units 87 and 89 would be in a "one" condition, register units 88 and 90 would be in a "zero" condition, and register unit 91 would be in a "one" condition. Under these circumstances, actuating circuits 104, 105, 106 and 108 would be actuated to shift switches 66, 67, 68 and 70 to offset position.

Tracing the output frequencies from the successive mixers 24–34; mixer 24 will have an output frequency of 2.73 megacycles per second; mixer 25, 4.73 megacycles per second; mixer 26, 8.73 megacycles per second; mixer 27, 16.73 megacycles per second; mixer 28, 24.73 megacycles per second; mixer 29, 40.73 megacycles per second; mixer 30, 72.73 megacycles per second; mixer 31, 200.73 megacycles per second; mixer 32, 328.73 megacycles per second; mixer 33, 840.73 megacycles per second; and mixer 34, 1352.73 megacycles per second.

For this output frequency, selector switch 57 would be in its D position and selector switch 58 would be in its C position to connect the output of amplifier 50 with output cable 60.

It will be observed that a continuous chain of mixers is maintained by the circuitry herein illustrated even though the number corresponding to the frequency to be generated in the binary code has "zeros" in a succession of the code positions. A system in simple analogy to the binary code positions for the number 1351 would require the connection of the output of mixer 24 to the input of mixer 25, the output of mixer 25 to the input of mixer 26, the output of mixer 26 to the input of mixer 30, the output of mixer 30 to the input of mixer 32, and the output of mixer 32 to the input of a mixer connected to a source of 1024 megacycles per second. It will be understood that in order to generate all frequencies between 1 and 1536 megacycles per second, using a simple analogy to the binary system, a tremendously more complex system of switching would be required than that illustrated.

It will be apparent that many modifications and variations may be effected without departing from the scope of the novel concepts of the present invention.

I claim as my invention:

1. In combination, a series of frequency sources having outputs for providing respective output signals of frequencies in the ratio of successive powers of two and corresponding to successive binary code positions, a series of switch means having respective first contact means connected to the outputs of respective ones of said series of frequency sources, having respective second contact means connected to the outputs of the respective frequency sources preceding the frequency sources to which the first contact means are connected and having respective third contact means, each of said switch means in one condition thereof being operative to connect its first and third contact means and in another condition thereof being operative to connect its second and third contact means, a series of frequency mixers having respective outputs, having respective first inputs connected to said third contact means of respective ones of said series of switch means and having respective second inputs, a series of amplifiers interposed between the outputs of respective ones of said series of frequency mixers and the second inputs of the respective next succeeding ones of said series of frequency mixers, and means providing a permanent conductive connection between the output of each amplifier and the second input of the respective next succeeding frequency mixer in said series of frequency mixers.

2. In combination, a series of frequency sources having outputs for providing respective output signals of frequencies in the ratio of successive powers of two and corresponding to successive binary code positions, a series of switch means having respective first means connected to the outputs of respective ones of said series of frequency sources, having respective second means connected to the outputs of the respective frequency sources preceding those to which the first means are connected and having respective third means, each of said switch means in one condition thereof being operative to connect its first and third means and in another condition thereof being operative to connect its second and third means, a series of frequency mixers having respective outputs, having respective first inputs connected to said third means of respective ones of said series of switch means and having respective second inputs connected to the outputs of the respective preceding ones of said series of frequency mixers, and means responsive to a first binary input signal representing a "one" in any of the code positions to which respective ones of said series of frequency sources correspond to set the switch means having its first means connected to the output of the next succeeding one of said series of frequency sources in said one condition to connect its first and third means, and responsive to a second binary input signal representing a "zero" in any of the code positions to which respective ones of said series of frequency sources correspond to set the switch means having its first means connected to the output of the next succeeding one of said series of frequency sources in said another condition to connect its second and third means.

3. In combination, a series of frequency sources for providing a series of frequencies corresponding to successive binary code positions, a series of frequency mixers having respective outputs and having respective first inputs, and having respective second inputs connected to the outputs of the respective preceding frequency mixers of said series of frequency mixers, means for selectively connecting the first input of each frequency mixer to one of said series of frequency sources and to the frequency source preceding said one of said series of frequency sources, and means responsive to a first binary input signal representing a "one" in the code position corresponding to said one of said series of frequency sources for causing the first input of the frequency mixer connectible to said one of said series of frequency sources and to the succeeding frequency source to be connected to said succeeding frequency source and responsive to a second binary input signal representing a "zero" in the given code position to cause the first input of the same frequency mixer to be connected to the one of said series of frequency sources corresponding to the code position.

4. In combination, a series of frequency sources for providing a series of frequencies corresponding to successive binary code positions, a series of frequency mixers having respective outputs, having respective first inputs, and having respective second inputs for connection to the outputs of respective preceding frequency mixers of said series of frequency mixers, means for selectively connecting the first input of each of said series of frequency mixers to one of said series of frequency sources and to a frequency source preceding said one frequency source in said series of frequency sources, and means responsive to a first binary input signal representing a "zero" in the code position corresponding to said one of said series of frequency sources to disconnect the frequency source next succeeding said one of said series of frequency sources from the frequency mixer connectible to said one of said series of frequency sources and the succeeding frequency source and to connect the first input of the last-mentioned frequency mixer to said one of said series of frequency sources corresponding to the code position.

References Cited in the file of this patent

UNITED STATES PATENTS

| | | |
|---|---|---|
| 2,231,634 | Monk | Feb. 11, 1941 |
| 2,428,389 | Singer | Oct. 7, 1947 |
| 2,546,974 | Chatterjea et al. | Apr. 3, 1951 |
| 2,547,549 | Wennemer | Apr. 3, 1951 |
| 2,639,417 | Bellairs et al. | May 19, 1953 |
| 2,848,616 | Tollefson | Aug. 19, 1958 |